US007883800B2

(12) United States Patent
Vinatier et al.

(10) Patent No.: US 7,883,800 B2
(45) Date of Patent: Feb. 8, 2011

(54) LITHIUM ION CONDUCTING LITHIUM SULPHUR OXYNITRIDE THIN FILM, AND A PROCESS FOR THE PREPARATION THEREOF

(75) Inventors: Philippe Vinatier, Bordeaux (FR); Alain Levasseur, Gradignan (FR); Brigitte Pecquenard, Talence (FR); Kyong-Hee Joo, Sea-Cho gu (KR)

(73) Assignee: Centre National de la Recherche Scientifique, Paris (FR)

( * ) Notice: Subject to any disclaimer, the term of this patent is extended or adjusted under 35 U.S.C. 154(b) by 922 days.

(21) Appl. No.: 11/339,607

(22) Filed: Jan. 26, 2006

(65) Prior Publication Data
US 2010/0136436 A9    Jun. 3, 2010

Related U.S. Application Data

(60) Provisional application No. 60/647,001, filed on Jan. 27, 2005.

(51) Int. Cl.
*H01M 6/18* (2006.01)
*C01B 21/20* (2006.01)
*C01B 17/00* (2006.01)
*C01B 17/45* (2006.01)

(52) U.S. Cl. ............... 429/322; 429/231.95; 429/323; 423/385; 423/386; 423/467; 423/512.1

(58) Field of Classification Search ......... 429/321, 429/231.3, 231.5, 231.95, 323; 423/385, 423/386, 467, 512.1
See application file for complete search history.

(56) References Cited

U.S. PATENT DOCUMENTS

| 5,512,147 A | 4/1996 | Bates et al. |
| 5,597,660 A | 1/1997 | Bates et al. |
| 6,818,356 B1* | 11/2004 | Bates .................. 429/322 |

OTHER PUBLICATIONS

K.H. Joo et al.; "Lithium Ion Conducting Lithium Sulfur Oxynitride Thin Film"; Electrochemical and Solid-State Letters vol. 7 No. 8; pp. A256-A258 (2004).

* cited by examiner

*Primary Examiner*—Jerry Lorengo
*Assistant Examiner*—Joseph V Micali
(74) *Attorney, Agent, or Firm*—Buchanan Ingersoll & Rooney PC (57) ABSTRACT

The disclosure herein relates to a lithium ion conducting electrolyte. This electrolytic material has improved ionic conductivity. The material disclosed herein is an amorphous compound of the formula $Li_xSM_wO_yN_z$ wherein x is between approximately 0.5 and 3, y is between 1 and 6, z is between 0.1 and 1, w is less than 0.3 and M is an element selected from B, Ge, Si, P, As, Cl, Br, I, and combinations thereof. The material can be prepared in the form of a thin film. The electrolyte material can be used in microbatteries and electronic systems.

7 Claims, 3 Drawing Sheets

Fig. 3

LITHIUM ION CONDUCTING LITHIUM SULPHUR OXYNITRIDE THIN FILM, AND A PROCESS FOR THE PREPARATION THEREOF

FIELD OF THE INVENTION

The present invention relates to a lithium ion conducting electrolyte in a thin film, as well as a method for producing it. This electrolyte can be used in particular in microbatteries and electrochromic systems.

BACKGROUND OF THE INVENTION

Lithium microbatteries can be used in various technological fields. A microbattery is produced by stacking a positive electrode material, an electrolytic material and a negative electrode material in thin layers. A microbattery is charged and discharged respectively with a transfer of lithium ions from one electrode to the other through the electrolyte, while electrons circulate via the external circuit. An improvement in the ionic conductivity of the electrolyte brings about a reduction in the internal resistance of the battery which can then be charged or discharged at a high current without an unacceptable ohmic drop.

Electrochromic systems can be formed by depositing an electrochemical cell, similar to that which forms a microbattery, onto a substrate made of glass or of transparent polymer covered with a transparent conducting layer. An electrochromic system is transparent and colorless in the charged state and colored in the discharged state or vice versa. Its operation relies on a transfer of ions from one electrode to another, as rapidly as possible, so as to minimize the response time of the system, said rapid transfer being promoted by an electrolyte having a high conductivity.

It is known to prepare electrolytes in thin film form by cathode sputtering. In this type of method, a target is used to obtain an electrolyte film made of amorphous material, it being understood that the amorphous structure generally enables the ionic conductivity of the electrolyte to be improved.

U.S. Pat. No. 5,512,147 and U.S. Pat. No. 5,597,660 describe the preparation and use of a thin film of $Li_xPO_yN_z$ (with x around 2.8, 2y+3z≈7.8 and $0.16 \leq z \leq 0.46$) as a solid electrolyte in a microbattery. The film is prepared by cathode sputtering of an $Li_3PO_4$ target in an atmosphere of nitrogen. The ionic conductivity of the film is around $2 \times 10^{-6}$ S/cm.

K. H. Joo, P. Vinatier et al., [Solid State Ionics, 2003, Vol. 160, No. 1-2, pp. 51-59] describe electrolytes formed from a thin film (1-2 μm) of $(1-X)LiBO_2-xLi_2SO_4$, x being 0.4 to 0.8. The maximum conductivity is obtained for x=0.7 and is $2.5 \times 10^{-6}$ S/cm.

EP-1 365 470 describes an electrolyte formed from LIPS containing, in at %, 20% to 60% Li, 3% to 20% P, 30% to 60% S and optionally up to 5% O and/or N. The film forming the electrolyte can be deposited on a substrate that will serve as an electrode. Deposition can be carried out in particular by cathode sputtering. In an electrochemical cell that comprises an anode formed of a 10 μm layer of lithium, a thin layer (0.5 μm) of electrolyte obtained from a "78% $Li_2S$–21.5 $P_2S_5$–0.5 $Li_3PO_4$" target, the ionic conductivity is $1.3 \times 10^{-3}$ S/cm at 25° C. (Cf. p. 6, §42 and 44). The target used for cathode sputtering is a target consisting of sulfides sensitive to atmospheric moisture. Such a target is therefore brittle and unsuited to use on an industrial scale.

S. J. Lee et al., [Electrochem. Commun., 2003, Vol. 5, No. 1, pp. 32-35] describe a battery in which the electrolyte is $Li_{1.9}Si_{0.28}P_{1.0}O_{1.1}N_{1.0}$, the active material of the positive electrode is $LiCoO_2$ and the negative electrode is $Si_{0.7}V_{0.3}$. The conductivities obtained for the electrolyte are around $8.8 \times 10^{-6}$ S/cm, a value that is quite close to those obtained in the present invention. The thin film of LiSiPON is obtained by cathode sputtering using a target consisting of $Li_3PO_4$ and $Li_2SiO_3$.

SUMMARY OF THE INVENTION

The object of the present invention is to provide an electrolytic material that has an improved ionic conductivity compared with materials of the prior art, and/or that can be prepared from stable targets suitable for industrial scale manufacture.

The material according to the present invention consists of an amorphous compound having the atomic composition $Li_xSM_wO_yN_z$ in which x is between approximately 0.5 and approximately 3, y is between approximately 1 and approximately 6, z is between 0.1 and 1, w is less than 0.3 and M represents one or more elements chosen from B, Ge, Si, P, As, Cl, Br and I.

DETAILED DESCRIPTION OF THE PREFERRED EMBODIMENTS

In one particular embodiment, x is between approximately 0.5 and approximately 2, y is between approximately 1 and approximately 4, z is between 0.1 and 1 and w=0. The material then consists of 100% $Li_xSO_yN_z$.

In another embodiment, w is not zero and the compound contains a small proportion of one or more M elements.

The material defined in this way has a high ionic conductivity, of the order of $10^{-5}$ S/cm, and good electrochemical stability between 0 and 5.5 volts. By way of examples, mention may be made of the compounds $LiSO_{1.4}N_{0.2}$ and $LiSO_{1.3}N_{0.3}$. Their ionic conductivity at 25° C. is $1 \times 10^{-5}$ S/cm and $2 \times 10^{-5}$ S/cm respectively. The electronic conductivity of the material is of the order of $10^{-13}$ S/cm.

The amorphous character of the material obtained can be confirmed by transmission electron microscopy or by X-ray diffraction.

The composition of the material obtained can be determined by various techniques: atomic absorption spectroscopy, Rutherford backscattering spectroscopy and energy dispersive X-ray spectroscopy.

The ionic conductivity can be determined by impedance measurement.

A material according to the invention can be prepared in the form of a thin film deposited on a substrate, by radiofrequency magnetron sputtering, deposition being carried out under the following conditions:

the plasma used for cathode sputtering is a gas consisting of nitrogen and optionally oxygen and/or argon, the minimum nitrogen content being 30 at %; and the target used for cathode sputtering is a target consisting of at least 80 at % $Li_2SO_4$ in the crystallized form.

The substrate used for deposition may consist of aluminum, silicon, carbon, stainless steel, a positive electrode material (in particular $TiS_2$ or $LiCoO_2$), a negative electrode material (in particular metallic lithium or a lithium alloy).

The minimum content of 30% nitrogen in the plasma is necessary for obtaining the amorphous structure of the material. In a preferred embodiment, the gas mixture of which the plasma consists contains 0 to 20 at % argon or oxygen.

The target may consist of the stable compound $Li_2SO_4$ in the commercially available crystallized form. It may also consist of a mixture containing at least 80 at % of crystallized $Li_2SO_4$, and at most 20 at % of one or more additives chosen from compounds acting as glass network formers, compounds acting as vitrification modifiers, and compounds that are the source of lithium ions. Among glass network formers, mention may be made of oxides, sulfides and nitrides of boron, germanium, silicon, arsenic or phosphorus. Among the compounds that are sources of lithium, mention may be made of lithium halides. Among the vitrification modifiers, mention may be made of the oxides, sulfides and nitrides of lithium, which are also sources of lithium. The respective proportions of $Li_2SO_4$ and an additive or additives are chosen so that the atomic composition of the mixture formed of $Li_2SO_4$ and the additive or additives is $Li_xSM_wO_yN_z$, x being between approximately 0.5 and approximately 3, y between approximately 1 and approximately 6, z between 0.1 and 1, w less than 0.3 and M representing one or more elements chosen from B, Ge, Si, P, As, Cl, Br and I.

In a particularly preferred embodiment, the substrate used for deposition of the layer of material according to the invention is one of the electrodes of the electrochemical device in which the layer of material is used as an electrolyte.

The present invention is described in greater detail with the aid of the following examples, to which it is however not limited.

EXAMPLES

For all the examples, a 5 cm diameter $Li_2SO_4$ target was used obtained from an $Li_2SO_4$ powder sold by Aldrich and kept under argon. The powder was compresses at uniaxial pressure of $1.23 \times 10^3$ $kg/cm^2$ and then sintered at 600° C. for 12 hours. This treatment was carried out twice so as to obtain a higher target density with a view to increasing the deposition rate. The target was then introduced into a radiofrequency magnetron sputtering unit, the entry airlock of which was provided with a small glove box.

For the cathode sputtering step in each example, a radiofrequency was applied to the device with a power of 50 W and a gas pressure of $7 \times 10^{-3}$ torr, which gave a deposition rate of 0.4 to 0.5 μm/h. The distance between the target and the substrate was 5 cm.

Example 1

The method was implemented under the above conditions, firstly with a gas consisting of 100% nitrogen, and secondly with a gas consisting of a 50/50 mixture of argon and nitrogen, and deposition was carried out on a glass slide covered with a thin layer of stainless steel.

Figure 1:
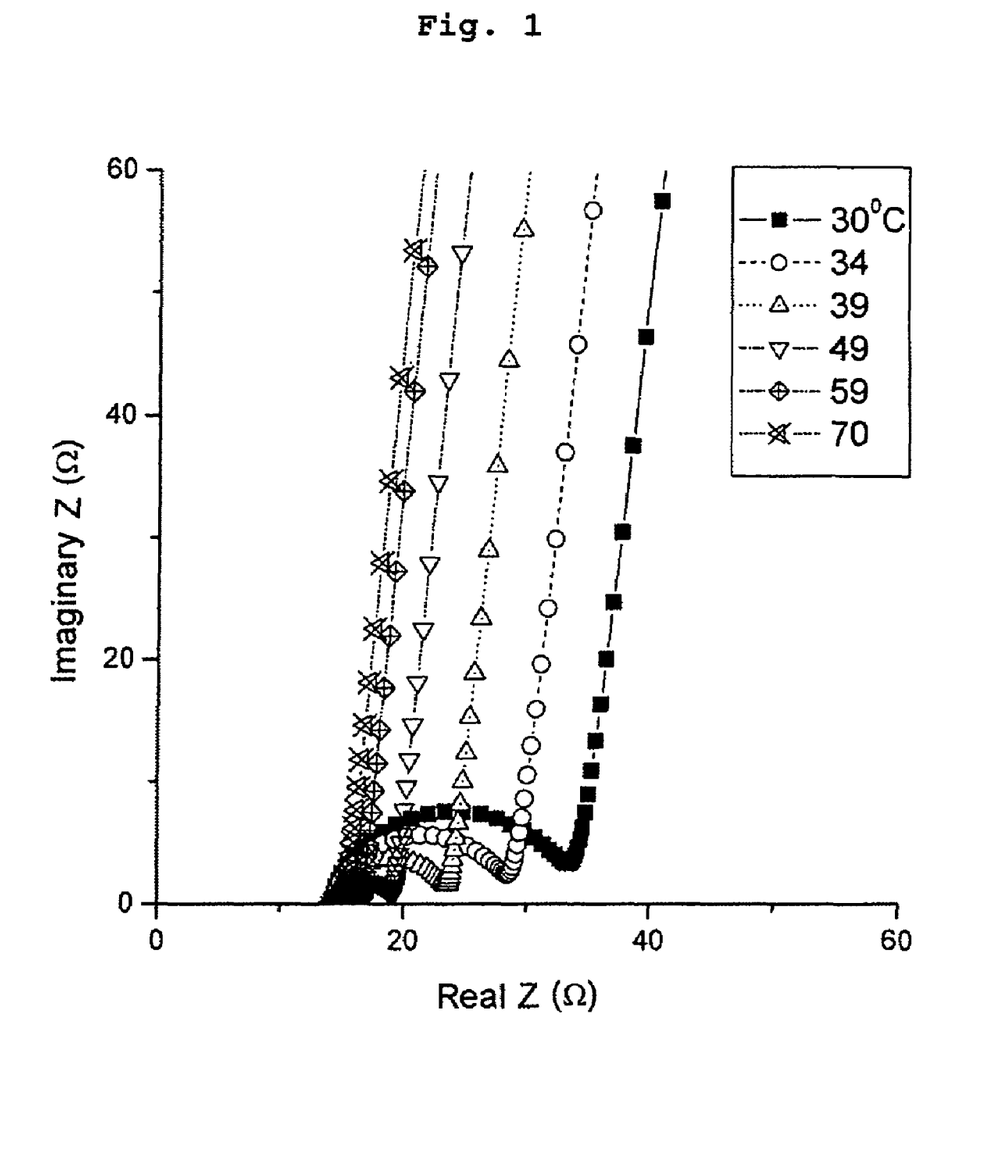
FIG. 1 illustrates the impedance diagram of the LISON-2 specimen, as discussed in Example 1.

The ionic conductivity of each film of $Li_xSO_yN_z$ material was determined from a "stainless steel/$Li_xSO_yN_z$/stainless steel" stack. The stack was obtained by depositing a thin layer of stainless steel above the layer of $Li_xSO_yN_z$ material. Measurements were carried out with the aid of a Solartron 1260 impedance meter, with a voltage of 20 mV amplitude, for frequencies of between 1 Hz and 2 MHz, for temperatures extending from room temperature to 373 K. The complex impedance diagram of the LISON-2 specimen is shown in FIG. 1. The value of the resistance for a given temperature corresponds to the abscissa of the break point of the impedance curve. The conductivity of the specimen was deduced from this at this temperature. The diagram also shows the good quality of the stainless steel/electrolyte interfaces.

The composition of each of the thin films deposited was determined by atomic absorption spectroscopy.

The results are given in the table below.

| Specimen | Gas | Composition | Conductivity $10^{-5}$ S/cm |
|---|---|---|---|
| LiSON-1 | 50% Ar—50% $N_2$ | $Li_{1.0}SO_{1.4}N_{0.2}$ | 1.0 |
| LiSON-2 | 100% $N_2$ | $Li_{1.0}SO_{1.3}N_{0.3}$ | 2.0 |

The LISON-2 specimen deposited in a plasma consisting only of nitrogen has a conductivity greater by about 1 order of magnitude than that of the LIPON of formula $Li_{2.9}PO_{3.3}N_{0.46}$, widely used in the prior art.

Figure 2:
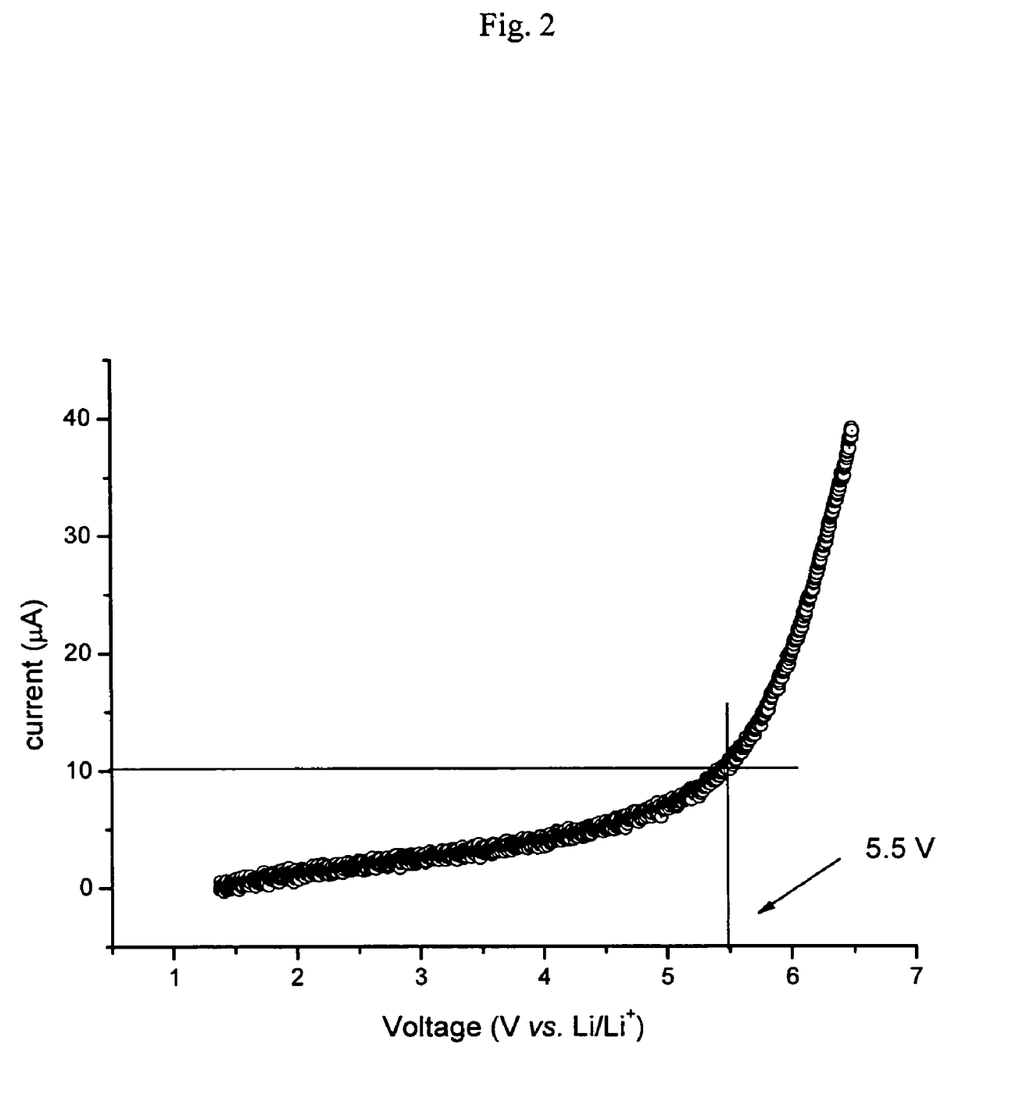
FIG. 2 illustrates the changes in current intensity as a function of voltage for the LISON-2 specimen, as discussed in Example 2.

In order to evaluate the electrochemical stability, the current-voltage characteristics of a stainless steel/$Li_xSO_yN_z$/stainless steel stack were recorded with the aid of a Keithley 2400 multimeter in 0.1 V voltage steps, between 0 and 8 V. FIG. 2 shows changes in the current intensity as a function of voltage for the LISON-2 specimen. It shows the good electrochemical stability of the specimen within the 0-5.5 V interval.

Example 2

Figure 3:
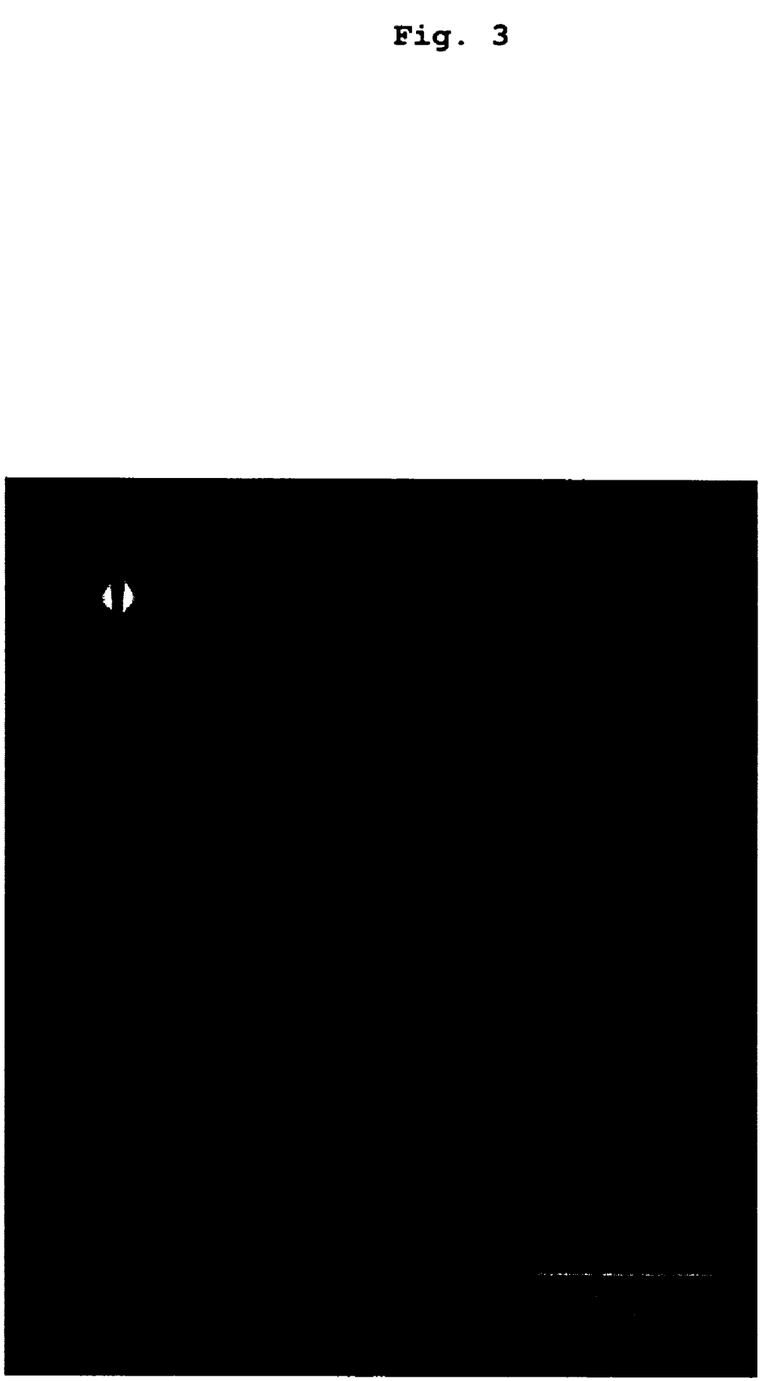
FIG. 3 shows the electron diffraction plate and the corresponding image for the LISON-3 specimen, as discussed in Example 3.

The operating procedure of the example was reproduced in order to prepare two specimens of $Li_xSO_yN_z$, but using a copper mesh as substrate, and a plasma consisting respectively of 100% nitrogen (specimen LISON-3) and a 50/50 $N_2$/Ar mixture (specimen LISON-4). FIG. 3 shows the electron diffraction plate and the corresponding image for the LISON-3 specimen. It confirms that the thin layer is amorphous.

The invention claimed is:

1. A material consisting of an amorphous compound having the atomic composition $Li_xSM_wO_yN_z$ in which x is between approximately 0.5 and approximately 3, y is between approximately 1 and approximately 6, z is between 0.1 and 1, w is less than 0.3 and M represents an element selected from the group consisting of B, Ge, Si, P, As, Cl, Br, I, and combinations thereof.

2. The material as claimed in claim 1, which is in the form of a film deposited on a substrate.

3. The material as claimed in claim 2, wherein the substrate is selected from the group consisting of aluminum, silicon, carbon, stainless steel, a positive electrode material, and a negative electrode material.

4. The material as claimed in claim 3, wherein the positive electrode material is $TiS_2$ or $LiCoO_2$, and the negative electrode material is metallic lithium or a lithium alloy.

5. The material as claimed in claim 1, wherein x is between approximately 0.5 and approximately 2, y is between approximately 1 and approximately 4, z is between 0.1 and 1 and w=0.

6. The material as claimed in claim 1, wherein w is not zero.

7. An electrochemical device comprising an electrolyte placed between a negative electrode and a positive electrode, wherein the electrolyte is a film of material as claimed in claim 2.

* * * * *

UNITED STATES PATENT AND TRADEMARK OFFICE
CERTIFICATE OF CORRECTION

| | |
|---|---|
| PATENT NO. | : 7,883,800 B2 |
| APPLICATION NO. | : 11/339607 |
| DATED | : February 8, 2011 |
| INVENTOR(S) | : Philippe Vinatier et al. |

It is certified that error appears in the above-identified patent and that said Letters Patent is hereby corrected as shown below:

Column 4, line 65, insert:

--8. A method for preparing a material as claimed in claim 2, comprising producing a deposit on a substrate by radiofrequency magnetron sputtering, wherein deposition is carried out under the following conditions:
  • the plasma used for cathode sputtering is a gas comprising nitrogen and optionally oxygen, argon, or combinations thereof, with the minimum nitrogen content being 30 at%; and
  • the target used for cathode sputtering is a target comprising at least 80% by weight of $Li_2SO_4$ in the crystallized form.
    9. The method as claimed in claim 8, wherein the substrate is selected from the group consisting of aluminum, silicon, carbon, stainless steel, a positive electrode material and a negative electrode material.
    10. The method as claimed in claim 8, wherein the plasma is a gaseous mixture comprising 0 to 20% argon or oxygen.
    11. The method as claimed in claim 8, wherein the target consists of $Li_2SO_4$.
    12. The method as claimed in claim 8, wherein the target comprises at most 20 at% of at least one additive selected from the group consisting of compounds acting as glass network formers, compounds acting as vitrification modifiers, and compounds that are the source of lithium ions.
    13. The method as claimed in claim 12, wherein the glass network-forming compound is selected from the group consisting of oxides, sulfides and nitrides of boron, germanium, silicon, arsenic or phosphorus.
    14. The method as claimed in claim 12, wherein the compounds that are the source of lithium are lithium halides.
    15. The method as claimed in claim 12, wherein the compounds acting as vitrification-modifiers are selected from the group consisting of oxides, sulfides and nitrides of lithium.

Signed and Sealed this
Third Day of May, 2011

David J. Kappos
*Director of the United States Patent and Trademark Office*

16. The method as claimed in claim 13, wherein the respective proportions of $Li_2SO_4$ and an additive or additives are chosen so that the atomic composition of the mixture formed of $Li_2SO_4$ and the additive or additives is $Li_xSM_wO_yN_z$, wherein x is between approximately 0.5 and approximately 3, y is between approximately 1 and approximately 6, z is between 0.1 and 1, w is less than 0.3 and M represents an element selected from the group consisting of B, Ge, Si, P, As, Cl, Br, I, and combinations thereof.

17. The method as claimed in claim 9, wherein the positive electrode material is $TiS_2$ or $LiCoO_2$ and the negative electrode material is metallic lithium or a lithium alloy.--

UNITED STATES PATENT AND TRADEMARK OFFICE
CERTIFICATE OF CORRECTION

| | |
|---|---|
| PATENT NO. | : 7,883,800 B2 |
| APPLICATION NO. | : 11/339607 |
| DATED | : February 8, 2011 |
| INVENTOR(S) | : Philippe Vinatier et al. |

It is certified that error appears in the above-identified patent and that said Letters Patent is hereby corrected as shown below:

Delete the title page and substitute therefore the attached title page showing the corrected number of claims in patent.

Column 4, line 65, insert:

--8. A method for preparing a material as claimed in claim 2, comprising producing a deposit on a substrate by radiofrequency magnetron sputtering, wherein deposition is carried out under the following conditions:
 • the plasma used for cathode sputtering is a gas comprising nitrogen and optionally oxygen, argon, or combinations thereof, with the minimum nitrogen content being 30 at%; and
 • the target used for cathode sputtering is a target comprising at least 80% by weight of $Li_2SO_4$ in the crystallized form.
 9. The method as claimed in claim 8, wherein the substrate is selected from the group consisting of aluminum, silicon, carbon, stainless steel, a positive electrode material and a negative electrode material.
 10. The method as claimed in claim 8, wherein the plasma is a gaseous mixture comprising 0 to 20% argon or oxygen.
 11. The method as claimed in claim 8, wherein the target consists of $Li_2SO_4$.
 12. The method as claimed in claim 8, wherein the target comprises at most 20 at% of at least one additive selected from the group consisting of compounds acting as glass network formers, compounds acting as vitrification modifiers, and compounds that are the source of lithium ions.
 13. The method as claimed in claim 12, wherein the glass network-forming compound is selected from the group consisting of oxides, sulfides and nitrides of boron, germanium, silicon, arsenic or phosphorus.
 14. The method as claimed in claim 12, wherein the compounds that are the source of lithium are lithium halides.

This certificate supersedes the Certificate of Correction issued May 3, 2011.

Signed and Sealed this
Thirty-first Day of May, 2011

David J. Kappos
*Director of the United States Patent and Trademark Office*

15. The method as claimed in claim 12, wherein the compounds acting as vitrification-modifiers are selected from the group consisting of oxides, sulfides and nitrides of lithium.

16. The method as claimed in claim 13, wherein the respective proportions of $Li_2SO_4$ and an additive or additives are chosen so that the atomic composition of the mixture formed of $Li_2SO_4$ and the additive or additives is $Li_xSM_wO_yN_z$, wherein x is between approximately 0.5 and approximately 3, y is between approximately 1 and approximately 6, z is between 0.1 and 1, w is less than 0.3 and M represents an element selected from the group consisting of B, Ge, Si, P, As, Cl, Br, I, and combinations thereof.

17. The method as claimed in claim 9, wherein the positive electrode material is $TiS_2$ or $LiCoO_2$ and the negative electrode material is metallic lithium or a lithium alloy.--

United States Patent
Vinatier et al.

(10) Patent No.: US 7,883,800 B2
(45) Date of Patent: Feb. 8, 2011

(54) LITHIUM ION CONDUCTING LITHIUM SULPHUR OXYNITRIDE THIN FILM, AND A PROCESS FOR THE PREPARATION THEREOF

(75) Inventors: Philippe Vinatier, Bordeaux (FR); Alain Levasseur, Gradignan (FR); Brigitte Pecquenard, Talence (FR); Kyong-Hee Joo, Seo-Cho gu (KR)

(73) Assignee: Centre National de la Recherche Scientifique, Paris (FR)

( * ) Notice: Subject to any disclaimer, the term of this patent is extended or adjusted under 35 U.S.C. 154(b) by 922 days.

(21) Appl. No.: 11/339,607

(22) Filed: Jan. 26, 2006

(65) Prior Publication Data
US 2010/0136436 A9    Jun. 3, 2010

Related U.S. Application Data

(60) Provisional application No. 60/647,001, filed on Jan. 27, 2005.

(51) Int. Cl.
| | |
|---|---|
| H01M 6/18 | (2006.01) |
| C01B 21/20 | (2006.01) |
| C01B 17/00 | (2006.01) |
| C01B 17/45 | (2006.01) |

(52) U.S. Cl. ............ 429/322; 429/231.95; 429/323; 423/385; 423/386; 423/467; 423/512.1

(58) Field of Classification Search .......... 429/321, 429/231.3, 231.5, 231.95, 323; 423/385, 423/386, 467, 512.1
See application file for complete search history.

(56) References Cited

U.S. PATENT DOCUMENTS

| | | |
|---|---|---|
| 5,512,147 A | 4/1996 | Bates et al. |
| 5,597,660 A | 1/1997 | Bates et al. |
| 6,818,356 B1 * | 11/2004 | Bates ............... 429/322 |

OTHER PUBLICATIONS

K.H. Joo et al.; "Lithium Ion Conducting Lithium Sulfur Oxynitride Thin Film", Electrochemical and Solid-State Letters vol. 7 No. 8; pp. A256-A258 (2004).

* cited by examiner

*Primary Examiner* — Jerry Lorengo
*Assistant Examiner* — Joseph V Micali
(74) *Attorney, Agent, or Firm* — Buchanan Ingersoll & Rooney PC (57) ABSTRACT

The disclosure herein relates to a lithium ion conducting electrolyte. This electrolytic material has improved ionic conductivity. The material disclosed herein is an amorphous compound of the formula $Li_xSM_wO_yN_z$ wherein x is between approximately 0.5 and 3, y is between 1 and 6, z is between 0.1 and 1, w is less than 0.3 and M is an element selected from B, Ge, Si, P, As, Cl, Br, I, and combinations thereof. The material can be prepared in the form of a thin film. The electrolyte material can be used in microbatteries and electronic systems.

15 Claims, 3 Drawing Sheets

UNITED STATES PATENT AND TRADEMARK OFFICE
CERTIFICATE OF CORRECTION

PATENT NO. : 7,883,800 B2
APPLICATION NO. : 11/339607
DATED : February 8, 2011
INVENTOR(S) : Philippe Vinatier et al.

It is certified that error appears in the above-identified patent and that said Letters Patent is hereby corrected as shown below:

Delete the title page and substitute therefore the attached title page showing the corrected number of claims in patent.

Column 4, line 65, insert:

--8. A method for preparing a material as claimed in claim 2, comprising producing a deposit on a substrate by radiofrequency magnetron sputtering, wherein deposition is carried out under the following conditions:
  • the plasma used for cathode sputtering is a gas comprising nitrogen and optionally oxygen, argon, or combinations thereof, with the minimum nitrogen content being 30 at%; and
  • the target used for cathode sputtering is a target comprising at least 80% by weight of $Li_2SO_4$ in the crystallized form.
    9. The method as claimed in claim 8, wherein the substrate is selected from the group consisting of aluminum, silicon, carbon, stainless steel, a positive electrode material and a negative electrode material.
    10. The method as claimed in claim 8, wherein the plasma is a gaseous mixture comprising 0 to 20% argon or oxygen.
    11. The method as claimed in claim 8, wherein the target consists of $Li_2SO_4$.
    12. The method as claimed in claim 8, wherein the target comprises at most 20 at% of at least one additive selected from the group consisting of compounds acting as glass network formers, compounds acting as vitrification modifiers, and compounds that are the source of lithium ions.
    13. The method as claimed in claim 12, wherein the glass network-forming compound is selected from the group consisting of oxides, sulfides and nitrides of boron, germanium, silicon, arsenic or phosphorus.
    14. The method as claimed in claim 12, wherein the compounds that are the source of lithium are lithium halides.

This certificate supersedes the Certificates of Correction issued May 3, 2011 and May 31, 2011.

Signed and Sealed this
Twenty-eighth Day of June, 2011

David J. Kappos
*Director of the United States Patent and Trademark Office*

15. The method as claimed in claim 12, wherein the compounds acting as vitrification-modifiers are selected from the group consisting of oxides, sulfides and nitrides of lithium.

16. The method as claimed in claim 13, wherein the respective proportions of $Li_2SO_4$ and an additive or additives are chosen so that the atomic composition of the mixture formed of $Li_2SO_4$ and the additive or additives is $Li_xSM_wO_yN_z$, wherein x is between approximately 0.5 and approximately 3, y is between approximately 1 and approximately 6, z is between 0.1 and 1, w is less than 0.3 and M represents an element selected from the group consisting of B, Ge, Si, P, As, Cl, Br, I, and combinations thereof.

17. The method as claimed in claim 9, wherein the positive electrode material is $TiS_2$ or $LiCoO_2$ and the negative electrode material is metallic lithium or a lithium alloy.--

(12) United States Patent
Vinatier et al.

(10) Patent No.: US 7,883,800 B2
(45) Date of Patent: Feb. 8, 2011

(54) LITHIUM ION CONDUCTING LITHIUM SULPHUR OXYNITRIDE THIN FILM, AND A PROCESS FOR THE PREPARATION THEREOF

(75) Inventors: Philippe Vinatier, Bordeaux (FR); Alain Levasseur, Gradignan (FR); Brigitte Pecquenard, Talence (FR); Kyong-Hee Joo, Sea-Cho gu (KR)

(73) Assignee: Centre National de la Recherche Scientifique, Paris (FR)

( * ) Notice: Subject to any disclaimer, the term of this patent is extended or adjusted under 35 U.S.C. 154(b) by 922 days.

(21) Appl. No.: 11/339,607

(22) Filed: Jan. 26, 2006

(65) Prior Publication Data
US 2010/0136436 A9 Jun. 3, 2010

Related U.S. Application Data

(60) Provisional application No. 60/647,001, filed on Jan. 27, 2005.

(51) Int. Cl.
*H01M 6/18* (2006.01)
*C01B 21/20* (2006.01)
*C01B 17/00* (2006.01)
*C01B 17/45* (2006.01)

(52) U.S. Cl. ............ 429/322; 429/231.95; 429/323; 423/385; 423/386; 423/467; 423/512.1

(58) Field of Classification Search ............... 429/321, 429/231.3, 231.5, 231.95, 323; 423/385, 423/386, 467, 512.1
See application file for complete search history.

(56) References Cited

U.S. PATENT DOCUMENTS

| 5,512,147 | A | 4/1996 | Bates et al. |
| 5,597,660 | A | 1/1997 | Bates et al. |
| 6,818,356 | B1 * | 11/2004 | Bates .................. 429/322 |

OTHER PUBLICATIONS

K.H. Joo et al.; "Lithium Ion Conducting Lithium Sulfur Oxynitride Thin Film"; Electrochemical and Solid-State Letters vol. 7 No. 8; pp. A256-A258 (2004).

\* cited by examiner

*Primary Examiner*—Jerry Lorengo
*Assistant Examiner*—Joseph V Micali
(74) *Attorney, Agent, or Firm*—Buchanan Ingersoll & Rooney PC (57) ABSTRACT

The disclosure herein relates to a lithium ion conducting electrolyte. This electrolytic material has improved ionic conductivity. The material disclosed herein is an amorphous compound of the formula $Li_xSM_wO_yN_z$ wherein x is between approximately 0.5 and 3, y is between 1 and 6, z is between 0.1 and 1, w is less than 0.3 and M is an element selected from B, Ge, Si, P, As, Cl, Br, I, and combinations thereof. The material can be prepared in the form of a thin film. The electrolyte material can be used in microbatteries and electronic systems.

17 Claims, 3 Drawing Sheets